United States Patent
En et al.

(10) Patent No.: US 6,433,391 B1
(45) Date of Patent: Aug. 13, 2002

(54) BONDED SOI FOR FLOATING BODY AND METAL GETTERING CONTROL

(75) Inventors: William George En, Milpitas; Dong-Hyuk Ju, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/877,631

(22) Filed: Jun. 8, 2001

(51) Int. Cl.⁷ .......................... H01L 29/00; H01L 21/00
(52) U.S. Cl. ........................................ 257/347; 257/349
(58) Field of Search .................................. 438/149–151; 257/347–350

(56) References Cited

U.S. PATENT DOCUMENTS 6,004,837 A * 12/1999 Gambino et al. ........... 438/157
6,210,998 B1 * 4/2001 Son ........................... 257/347
6,225,667 B1 * 5/2001 Buynoski et al. ........... 257/347

OTHER PUBLICATIONS

Jean–Pierre Colinge, Silicon–On–Insulator Technology: Materials to VLSI, 2$^{nd}$ Edition, 1997; Chapter 3: SOI Materials Characterization pp. 95–96 and Chapter 7: The SOI MOSFET Operating in a Harsh Environment p. 228.

* cited by examiner

*Primary Examiner*—Jey Tsai
(74) *Attorney, Agent, or Firm*—Renner, Otto, Boisselle & Sklar, LLP

(57) ABSTRACT

A device and method for making a semiconductor-on-insulator (SOI) structure having an insulator layer disposed between a semiconductor substrate and a semiconductor layer. An interface between the insulator layer and the semiconductor layer bleeds off extra carriers. Active regions are defined in the semiconductor layer by isolation trenches and the insulator layer.

5 Claims, 6 Drawing Sheets

BONDED SOI FOR FLOATING BODY AND METAL GETTERING CONTROL

TECHNICAL FIELD

The present invention generally relates to the manufacture of semiconductor structures and, more specifically, relates to the manufacture of semiconductor-on-insulator (SOI) structures.

BACKGROUND ART

Semiconductor-on-insulator (SOI) structures have several advantages over conventional bulk substrates: the elimination of latch-up, reduced short-channel effects, improved radiation hardness, dynamic coupling, lower parasitic junction capacitance, and simplified device isolation and fabrication. Such advantages allow semiconductor device manufacturers to produce low-voltage, low-power, high-speed devices thereon. For example, metal-oxide semiconductor field effect transistors (MOSFETs) are commonly formed on SOI structures. However, MOSFETs formed on such SOI structures suffer from a floating body effect (FBE).

Unlike bulk silicon MOSFETs, an SOI MOSFET is usually electrically floating in relation to the substrate. In a non-fully depleted MOSFET, carriers (holes in nMOSFETs and electrons in pMOSFETs) generated by impact ionization accumulate near the source/body junctions of the MOSFET. Eventually, sufficient carriers will accumulate to forward bias the body with respect to the source thus lowering the threshold voltage through the body-bias effect. Extra current will start flowing resulting in a "kink" in the I–V characteristics. The extra current flow reduces the achievable gain and dynamic swing in analog circuits, and gives rise to an abnormality in the transfer characteristics in digital circuits. Additionally, the FBE causes higher device leakages and undesirable transient effects.

One attempted solution to solve problems due to the FBE is to provide a contact to the body for hole current collection. However, currently available hole collection schemes, including the use of a side-contact or a mosaic source are very inefficient and consume significant amounts of wafer area.

Therefore, there exists a strong need in the art for an SOI structure with a buried insulator layer that bleeds off extra carriers from a channel to the main substrate.

SUMMARY OF THE INVENTION

According to one aspect of the invention, the invention is a semiconductor-on-insulator (SOI) structure having a buried insulator layer disposed between a semiconductor substrate and a semiconductor layer and an interface between the oxide layer and the semiconductor layer that bleeds off extra carriers.

According to another aspect of the invention, the invention is a method of fabricating a semiconductor-on-insulator (SOI) structure having an insulator layer disposed between a semiconductor substrate and a semiconductor layer. The method includes the steps of depositing an insulator layer on a first semiconductor substrate. Further, the method includes the step of creating a zone of weakness under a surface of a second semiconductor substrate. Next, the method requires the placing of the second semiconductor substrate on top of the first semiconductor substrate such that the oxide layer of the first semiconductor substrate is in contact with a surface of the second semiconductor substrate. The method also includes the step of breaking the zone of weakness of the second semiconductor substrate and repairing a damaged surface resulting from the breaking of the zone of weakness of the second semiconductor substrate.

According to another aspect of the invention, the invention is a method of fabricating an SOI structure as described above. However, the method step of repairing the surface resulting from the breaking of the zone of weakness further includes the step of polishing the surface in order to remove residual weak zone damage.

According to another aspect of the invention, the invention is a method of fabricating an SOI structure as described in the first method above. The method further includes the additional step of fusing the insulator layer of the first semiconductor substrate with the second semiconductor substrate.

BRIEF DESCRIPTION OF DRAWINGS

These and further features of the present invention will be apparent with reference to the following description and drawings, wherein.

DISCLOSURE OF INVENTION

Figure 1:
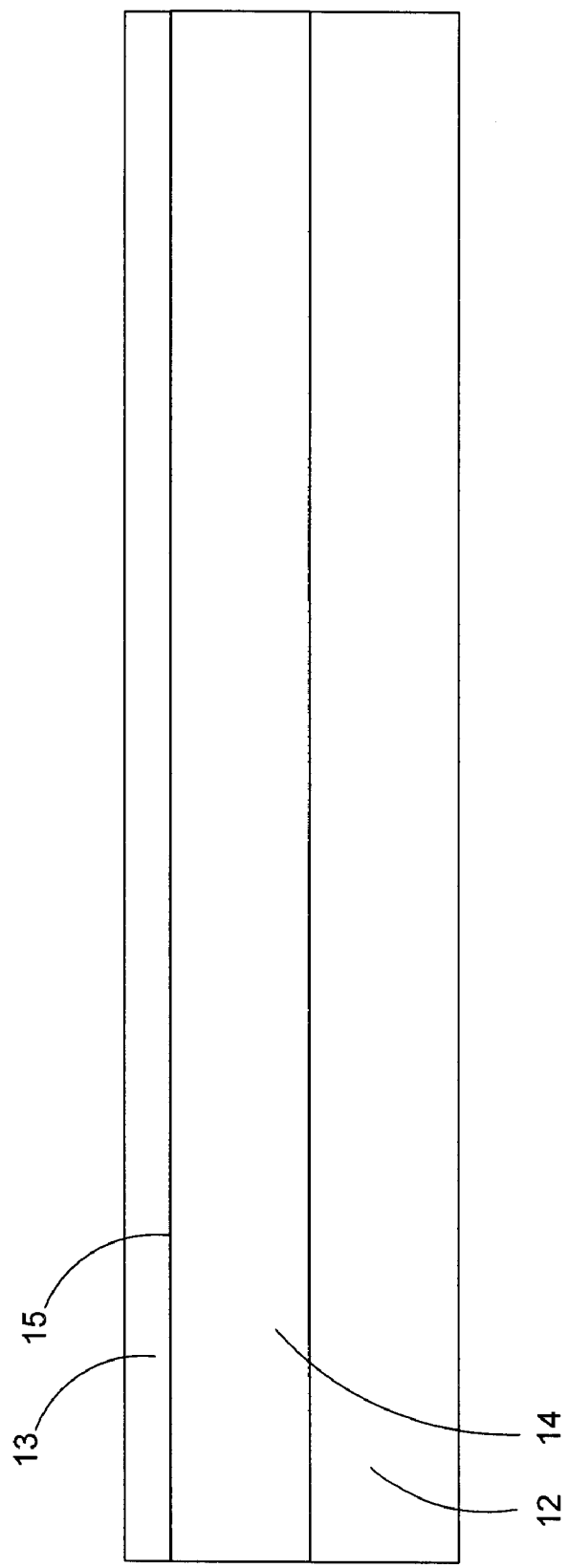
FIG. 1 is a cross-section of an SOI structure according to the present invention.

To illustrate the present invention in a clear and concise manner, the drawings may not necessarily be to scale and certain features may be shown in a partial schematic format.

The present invention is a semiconductor on insulator (SOI) structure, and method of making the same, comprising an insulator layer interposed between a semiconductor substrate and a semiconductor layer. The insulator layer has a damaged surface that forms an interface between the insulator layer and the semiconductor layer. Electronic devices such as metal-oxide semiconductor field effect transistors, i.e. MOSFETs, may be formed in device regions of the semiconductor layer defined laterally by isolation regions such as shallow trench isolation (STI) regions and vertically by the insulator layer.

MOSFETs formed on such SOI structures will be significantly less affected by the FBE due to the damaged surface of the insulator layer allowing leakage at a level greater than the leakage allowed by the currently used material of $SiO_2$ wherein the $SiO_2$ interface with the semiconductor layer is not damaged due to the $SiO_2$ being thermally grown.

The insulator-semiconductor interface or oxide trap region is formed by defects in the insulator layer. These defects are formed during the formation of the insulator layer. The exposed surface of the insulator layer is rough due to the incomplete formation of the lattice structure as well as partially formed grains. Controlling the insulator formation process e.g. the time and temperature can control the amount of defects in the exposed surface. Alternatively, the exposed surface of the insulator layer may be implanted with ions which include indium (In) for an N-channel device; arsenic (As) or antimony (Sb) for a P-channel device; and germanium (Ge), argon (Ar), neon (Ne), silicon (Si) or xenon (Xe) for either an N-channel or P-channel device to further damage the surface. More specifically, the damage in the upper surface of the insulator layer forms oxide traps at or near the upper surface of the insulator layer.

The energy level and doping concentration for heavy ion implantation is sufficient to create the above-described oxide trap region at or near the surface of the insulator layer. Suitable ranges of energy levels and doping concentrations for the heavy ions may be determined empirically and will depend upon factors such as the type of heavy ion, the amount of the damage desired and the like. For the ion species indium, arsenic, antimony, germanium and xenon, an exemplary energy range for the heavy ion implantation is about 100 keV to about 300 keV, and an exemplary dosage range is between about $1\times10^{14}$ to about $1\times10^{16}$ atoms/cm$^2$.

The oxide traps within the insulator-semiconductor interface or oxide trap region promote carrier recombination, thereby removing a charge from the channel. The carriers are drawn to the oxide trap region by a bias potential (e.g., having an absolute value of about 2 V to about 10 V) applied to the SOI structure. For an N-channel device, the bias potential is negative and for a P-channel device, the bias potential is positive.

Additionally, the insulator-semiconductor interface also provides metal gettering control to maximize diffusion of heavy metal ions in the channel through the buried insulator layer. Since a diffusion speed of heavy metals in the conventional undamaged silicon dioxide film is lower than that in the silicon, it is difficult to cause the heavy metals in the device formation region to be diffused to a gettering site region so that the heavy metals are captured or trapped by the gettering site region.

The insulator layer can be tailored to allow a leakage current greater than the leakage current allowed through a traditional buried oxide layer of SiO$^2$ by controlling the damage at the upper surface, e.g. the arrangement of the exposed lattice structure and/or the grain size. Further, the leakage current through the insulator layer can be tailored so that the total chip power consumption does not significantly increase. Additionally, the damage at interface can be tailored to maximizes diffusion of heavy ions through the burried insulator layer. Further, the floating body effect is reduced.

The insulator layer can be regarded as a dielectric concerning the parasitic capacitance between the substrate and a conductor formed over the device region if the insulator layer has a suitable electrical resistivity for the operating frequency range of the semiconductor device.

It should be appreciated that the resistance and capacitance of the insulator layer is such that its RC time constant should be large enough that the semiconductor layer is generally electrically isolated from the semiconductor substrate with respect to alternating-current (AC) operation, while it is generally electrically connected to the semiconductor substrate with respect to very low frequency or direct-current (DC) operation. In other words, the insulator acts as a low frequency filter and allows the low frequency charge buildup, i.e. holes or electrons, to pass through due to its low frequency characteristics. On the other hand, during normal operation associated with the respective active devices the insulator acts as a barrier to the higher frequency currents passing through the insulating layer and isolates the active regions from the underlying substrate. An RC time constant greater than 1 usec is preferred.

Therefore, the parasitic capacitance can be kept low. For example, when the operating frequency, or the applicable electric signal frequency of the semiconductor device is 1 GHz, the electrical resistivity of the insulator layer is preferably 10 ohm-cm or greater.

Now referring to FIG. 1, an exemplary embodiment of an SOI structure 10 is illustrated. The SOI structure 10 is formed using a semiconductor substrate 12, a buried insulator layer 14 formed on the semiconductor substrate 12 and a semiconductor layer 13 disposed on the insulator layer 14. The insulator layer 14 has a damaged upper surface which forms an insulator-semiconductor interface 15.

An exemplary insulator layer 14 will be tailored to provide greater mobility for the carriers than traditional SiO$^2$ to more efficiently remove the extra carriers. The exemplary insulator layer 14 may have a thickness of between 1800 and 2200 Å. Whereas, an exemplary semiconductor layer 13 disposed on the insulator layer 14 may have a thickness of between 800 and 1000 Å. Suitable semiconductor materials such as silicon (Si), silicon carbide (SiC), or silicon germanium (SiGe) may be used as the semiconductor layer 13 disposed on the insulator layer 14 as well as the semiconductor substrate 12. Within the active region of the semiconductor layer 13 disposed on the insulator layer 14, electrical devices may be formed.

Figure 2:
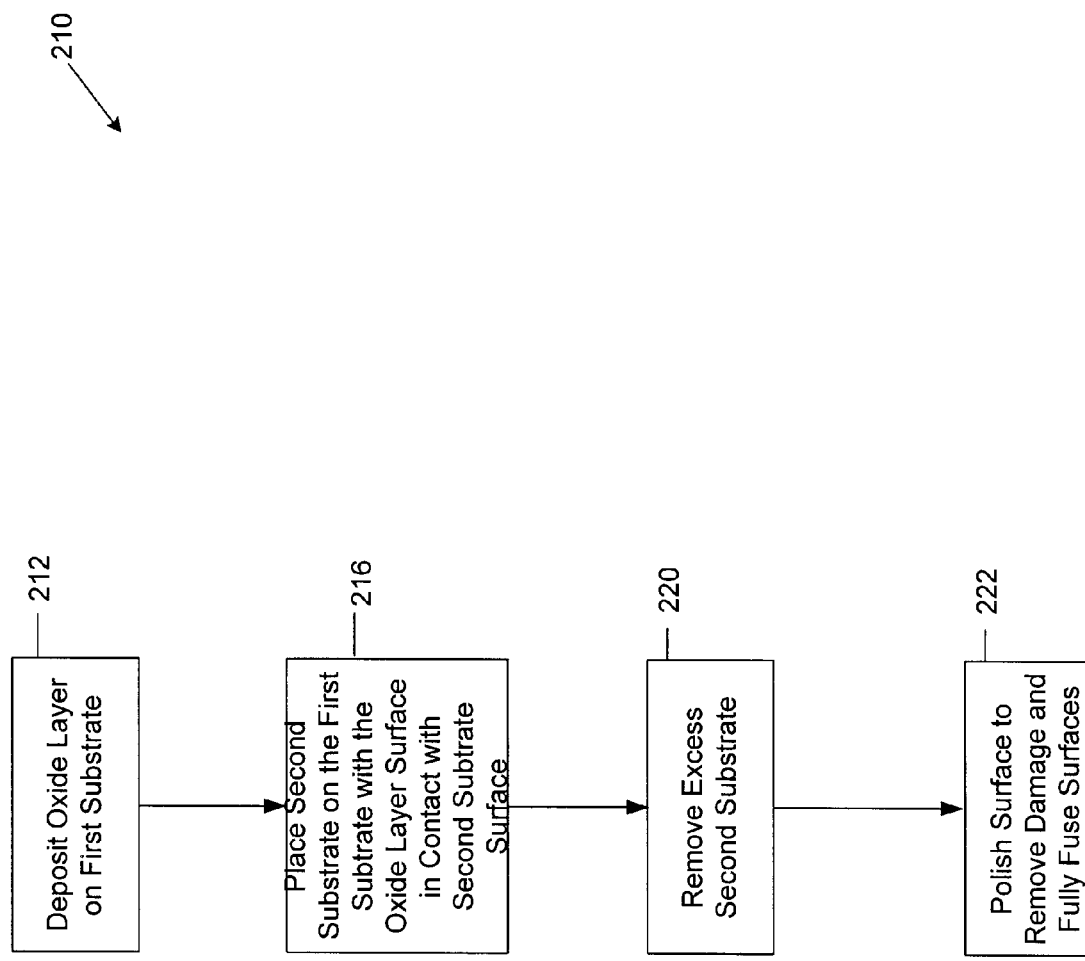
FIG. 2 is a flow diagram of a method of manufacturing the SOI structure according to the present invention.
Figure 3A:
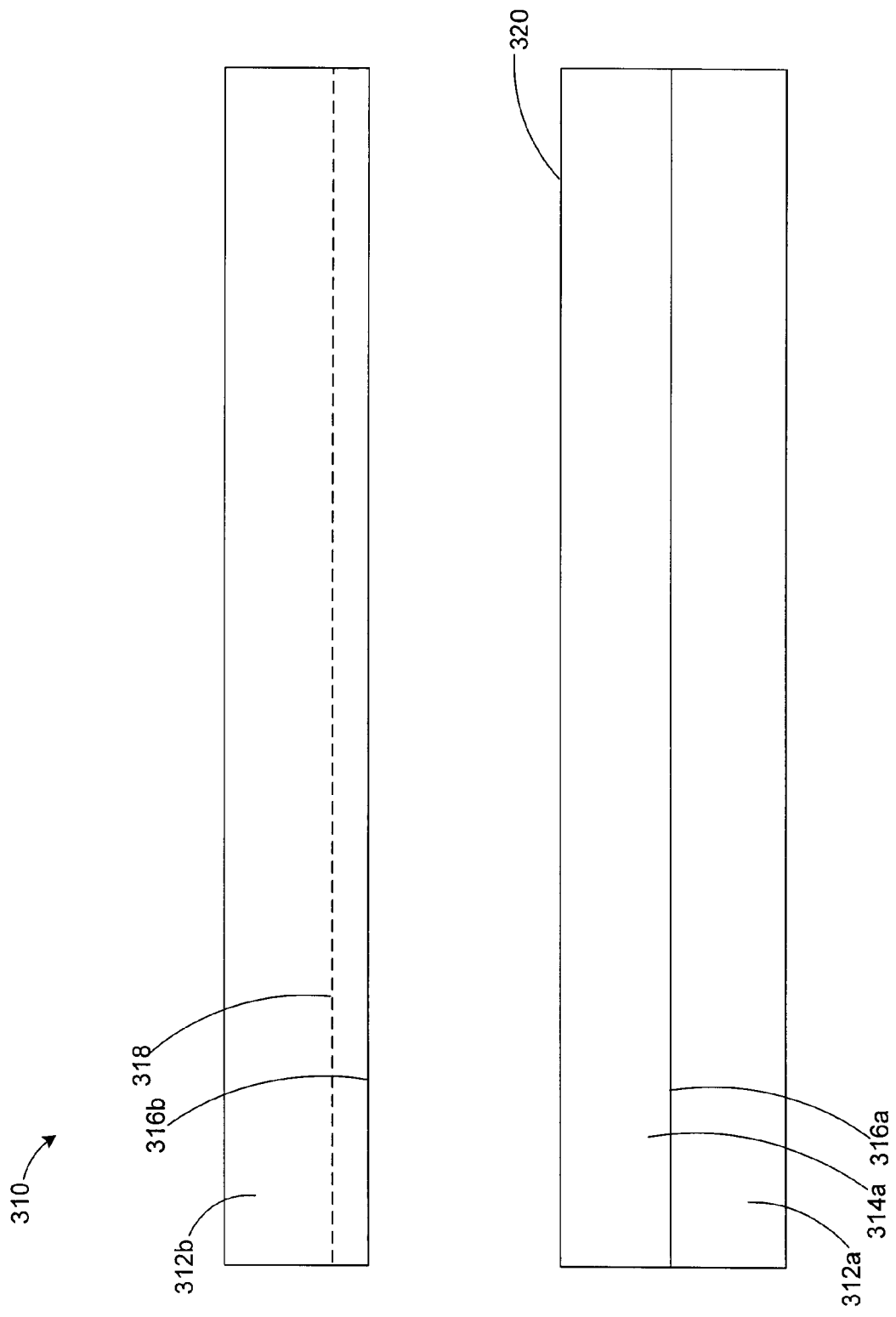
FIGS. 3A–3C are cross-section views of the SOI structure according to the present invention at intermediate stages of manufacture.
Figure 3B:
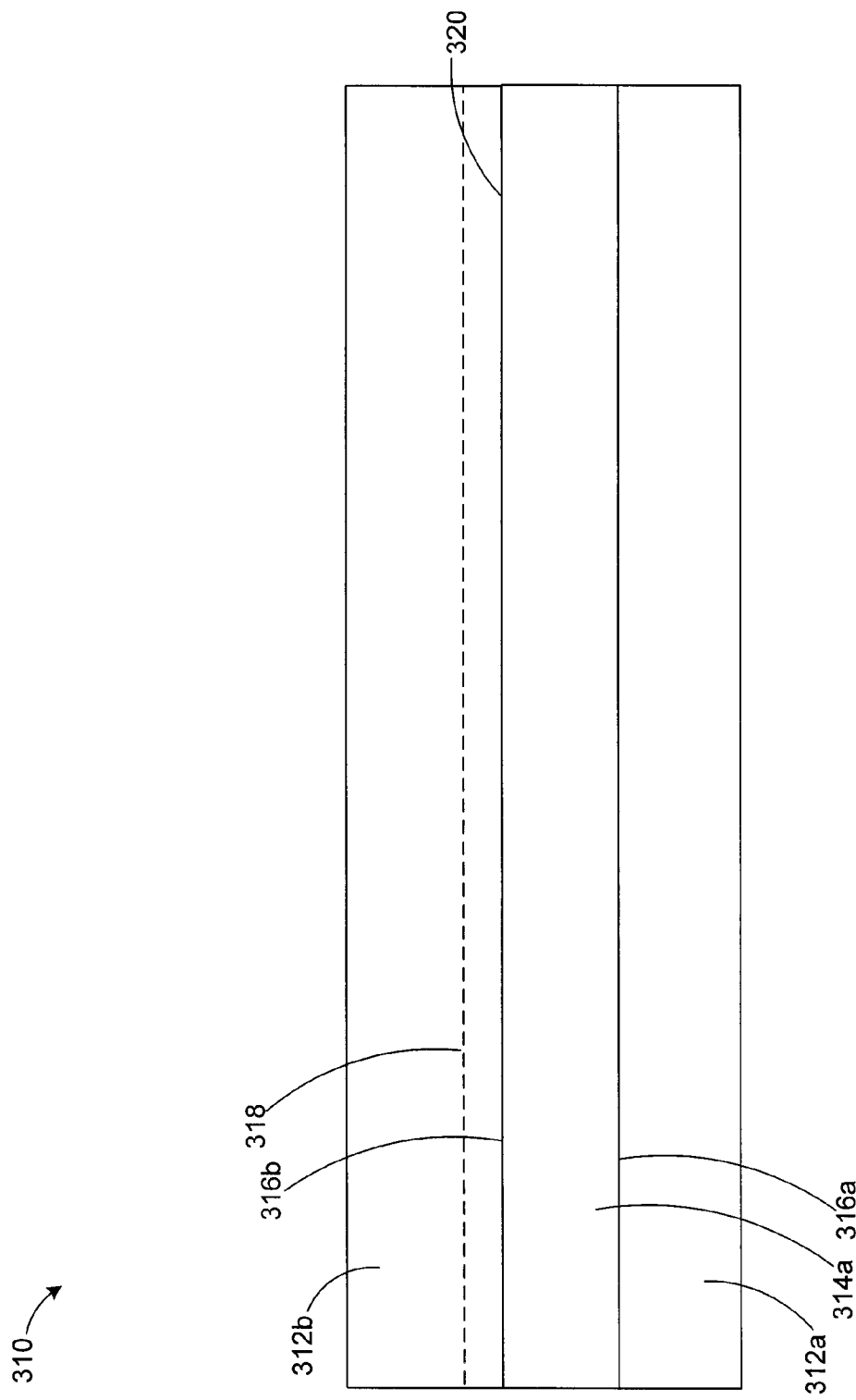
Figure 3C:
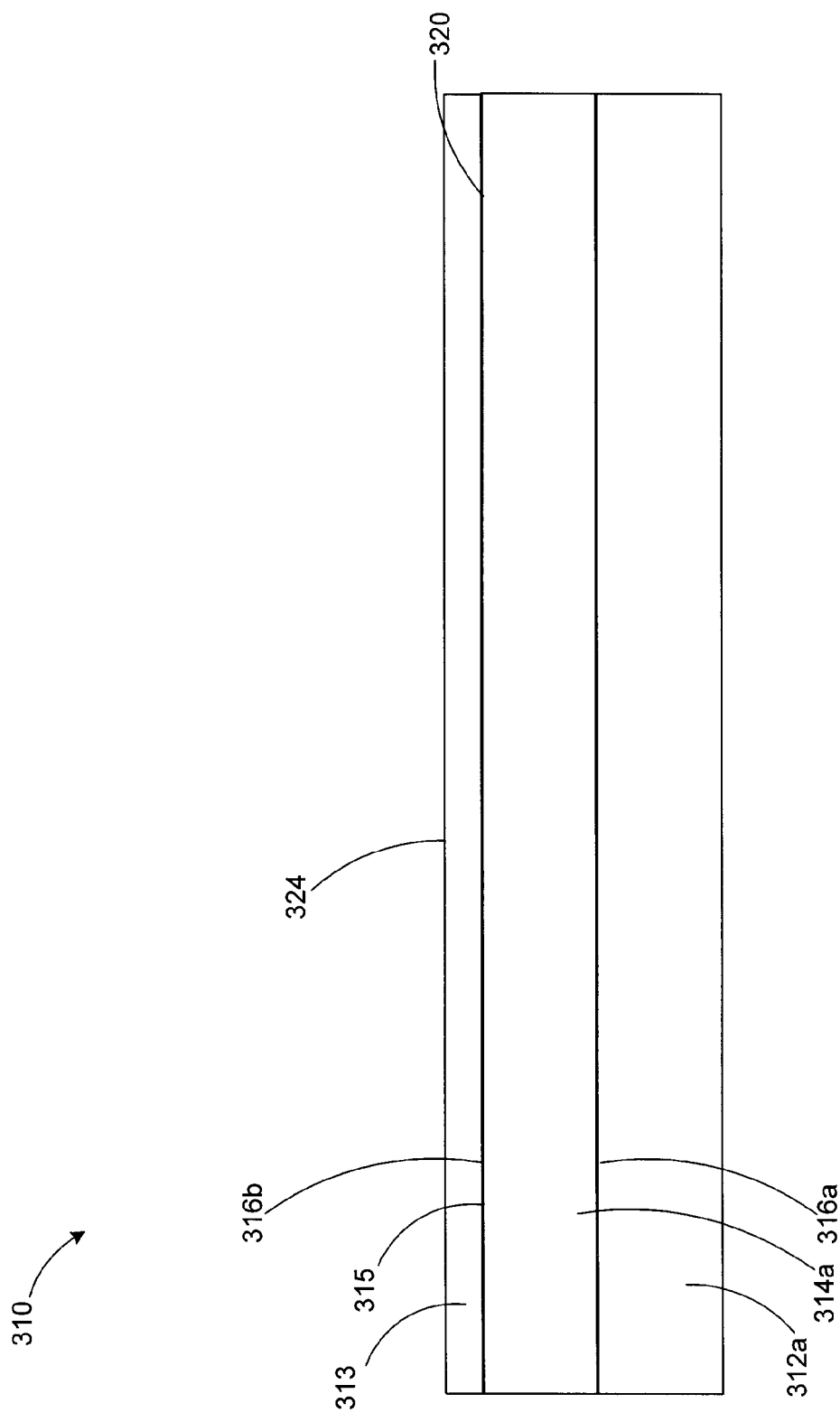

The steps of a method 210 for fabricating an SOI structure 310 (which may be similar to the semiconductor device 10 described above) are outlined in the flow chart shown in FIG. 2. FIGS. 3A–3C illustrate various steps of the method 210. It will be appreciated that the method 210 and the semiconductor device 310 described below are merely exemplary, and that suitable embodiments of the many variations in materials, thicknesses, and/or steps may alternatively be used in the method 210 and/or the SOI structure 310.

In step 212 of the method 210, semiconductor substrate 312a has an insulator layer 314a formed on surface 316a as an intermediate stage of manufacture for the SOI structure 310.

As shown in FIG. 3A, the semiconductor substrate 312b has been flipped over and placed above the semiconductor substrate 312a with the insulator layer 314a. As shown by the dashed line in FIG. 3A, semiconductor substrate 312b has a zone of weakness 318 formed below the surface 316b having a thickness of between 800 Å and 1000 Å. An exemplary insulator layer 314a may have a thickness of between 1800 Å and 2200 Å. Suitable semiconductor materials such as silicon(Si), silicon carbide (SiC), or silicon germanium(SiGe) may be used as the semiconductor material in semiconductor substrates 312a, 321b.

It will be appreciated that other methods may be used to form the intermediate substrates shown in FIG. 3A. It will further be appreciated that any processes, which will allow the semiconductor substrate to be broken along a plane leaving a thin layer of silicon on the SOI structure, may form the zone of weakness 318. It will also be appreciated that the zone of weakness may be formed through the surface 316b before the surface 316b comes in contact with the insulator layer 314a of semiconductor substrate 312a. It will also be understood that the zone of weakness alternatively may be formed through a thick portion of the semiconductor substrate 312b opposite the surface 316b after the surface has come into contact with the insulator layer 314a to form the intermediate device shown in FIG. 3A.

In step 216 of the method 210, a surface 320 of the insulator layer 314a is placed in contact with a surface 316b of the semiconductor substrate 312b. Thus, surfaces 320 and 316b adhere to each other well enough for further processing to be done. The resulting structure is illustrated in FIG. 3B.

In step 220, the semiconductor substrate 312b is broken along the zone of weakness 318 forming a semiconductor layer 313. It will be appreciated that processes, which include heat or mechanical pressure, for example, may break the zone of weakness. The resulting structure is illustrated in FIG. 3C.

In step 222 of the method 210, a polishing process is performed on the exposed damaged surface 324. The polishing process removes residual weak zone damage. The polishing process repairs the upper surface 324 of the SOI substrate 310 for future processing of electrical devices. The structure is illustrated in FIG. 3C.

Further, in step 222, the SOI substrate 310 may be heated until the insulator layer 314a and the semiconductor layer 313 are fully fused. The final structure is illustrated in FIG. 1.

It will be appreciated that many alternative sequences or steps may be used to accomplish the SOI structure 310. For example, the heating and fusing process in step 222 may be done following step 216. Examples of other well-known techniques include zone melting recrystallization (ZMR), Bonded and Etchback (BESOI or the Smart-Cut.

Alternatively, semiconductor substrate 312a may have a thick, undoped polysilicon film deposited by Chemical Vapor Deposition (CVD) using dichlorosilane ($SiH_2Cl_2$) or the like to cover the substrate 314a. To flatten or planarize the surface of the undoped polysilicon film, the film is polished using a slurry until the desired thickness is reached. The slurry is, for example, made of an alkaline solution such as a potassium hydroxide (KOH) solution containing silica particles of 20 to 30 nm in diameter. A thin silicon layer 313 is formed upon the undoped polysilicon layer 314a using the method described above. The undoped polysilicon layer typically has a large resistivity of 1000 ohm-cm or more. Therefore, the undoped polysilicon layer can be regarded as or equivalent to a dielectric concerning the parasitic capacitances between the substrate 312 and the interconnecting conductors for the operating frequency in the order of MHz or GHz. This means that the parasitic capacitances are kept low. Silicon has a dielectric constant of 11.0 and $SiO_2$ has a dielectric constant of 3.9.

Figure 4:
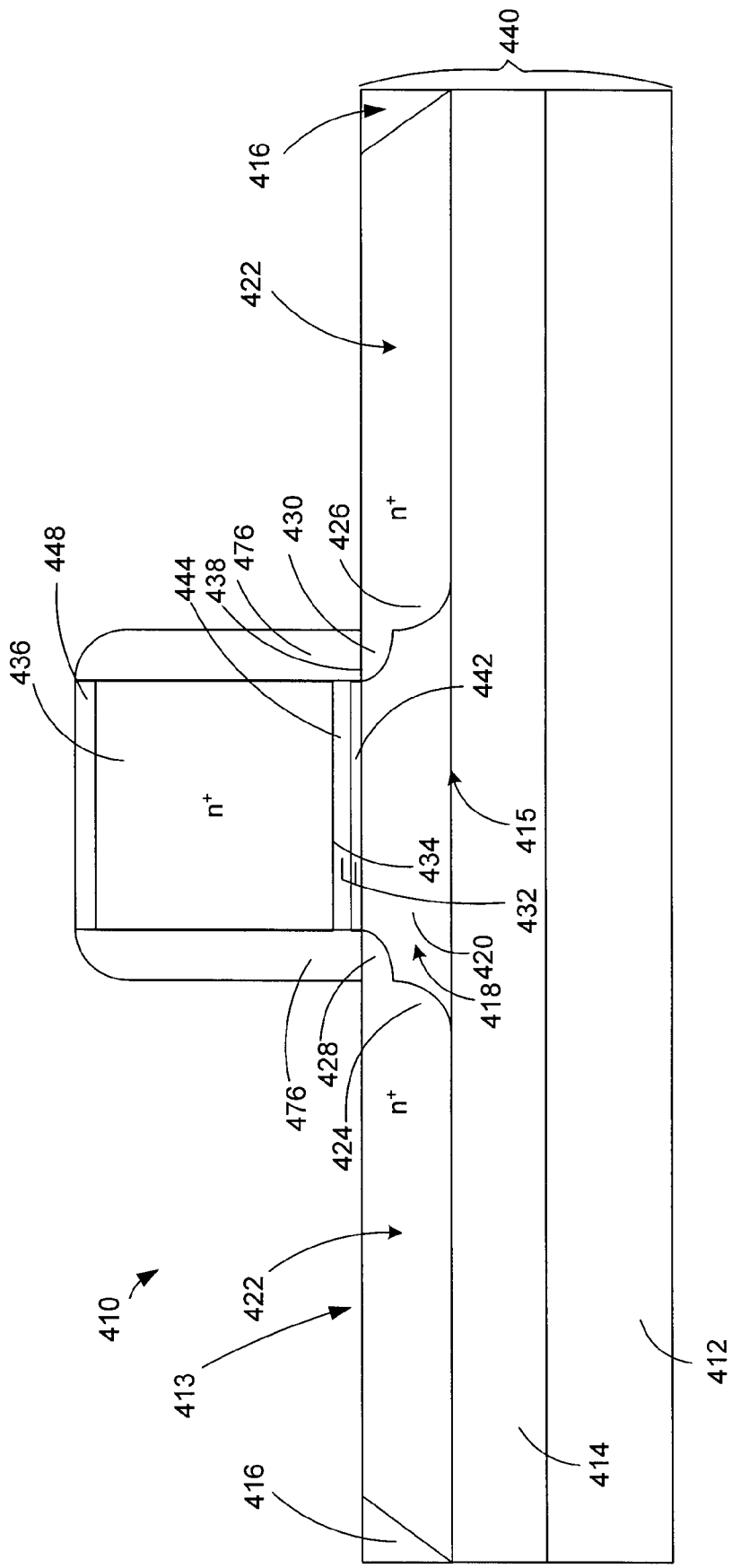
FIG. 4 is a cross-section of an SOI structure according to the present invention having a device formed thereon.

A device 410 on a semiconductor-on-insulator (SOI) structure 440 of the present invention is shown in FIG. 4 and described below, although other devices may be formed as well without departing from the invention herein described. Additionally, a device 410 or other devices may be formed on other types of SOI structures such as germanium-on-insulator wherein the insulator layer is leaky due to a damaged surface as described above. It will be appreciated that the exemplary semiconductor device 410 described below may include many variations in materials, thicknesses, and/or structures.

Referring now to FIG. 4, an SOI substrate 440 is shown with an electrical device 410 formed thereon. The device 410 includes a conventional polysilicon gate. As shown in FIG. 4, the SOI substrate 440 includes a semiconductor substrate 412, an insulator layer 414 formed on the semiconductor substrate 412 and a semiconductor layer 413 disposed on the insulator layer 414. A damaged upper surface of the insulator layer 414 forms an insulator-semiconductor interface 415. The insulator-semiconductor interface 415 bleeds off extra carriers. Within the semiconductor layer 413 disposed on the insulator layer 414, shallow trench isolation (STI) regions 416 along with the insulator layer 414 define the placement of a semiconductor active region 418. The STI regions 41 6 are insulator-filled to electrically isolate individual electrical devices such as the device 410. Other isolation techniques that are known in the art may be used to isolate the device 410.

In an exemplary embodiment, as illustrated in FIG. 4, the active region 418 has a channel 420, and source and drain regions 422. The source and drain 422 are shown with respective deep implant regions 424 and 426, as well as respective extension regions 428 and 430. The active region 418 may be doped with p-type dopants for n-type channel devices and/or n-type dopants for p-type channel devices. An exemplary range of concentration of these dopants is between $1\times10^{18}$ atoms/$cm^3$ and $5\times10^8$ atoms/$cm^3$ for the p-type channel 420 and between $1\times10^{20}$ and $5\times10^{20}$ atoms/$cm^3$ for the N+ regions 422.

A gate dielectric 432 is interposed between the lower surface 434 of a gate electrode 436 and an upper surface 438 of the SOI semiconductor substrate 440. The gate dielectric 432 illustrated in FIG. 4 is a multi-layer dielectric, however the gate dielectric could be a single layer dielectric. The gate dielectric 432 may be made of suitable gate dielectric materials, such as silicon dioxide ($SiO_2$), silicon nitride ($Si_3N_4$), aluminum oxide ($Al_2O_3$), hafnium oxide ($HfO_2$), silicon oxynitride (SiON), or the like. In this embodiment, dielectric layer 442 is made of $SiO_2$ and dielectric layer 444 is made of $Si_3N_4$.

The gate electrode 436 may be made of typical, well-known conductive materials, for example polysilicon.

On top of the gate electrode 436 is an oxide layer 448. The oxide layer 448 may be made of silicon dioxide ($SiO_2$) or any of a variety of suitable materials, which could be used to protect portions of the gate electrode 436 from an etchant. Spacers 476 extend upward from the upper surface 438 of the SOI substrate 440 on either side of the gate electrode 436. Exemplary spacers 476 may have a height of between 3000 and 4000 Å

It will be appreciated that known methods may be used to form the device 410 shown in FIG. 4. It will further be appreciated that the insulator-filled isolation trenches 416 may be formed in an intermediate step of a method, rather than being formed prior to or after the forming of the device 410.

The source and the drain regions 422 regions may be formed by a combination of implants, such as main perpendicular implants and extension perpendicular implants. The extension perpendicular implant is a relatively low energy, low concentration implant which is capable of producing the source and drain extensions 428 and 430. The total concentration of the extension implants may be, for example, between $1\times10^{19}$ atoms/$cm^3$ and $1\times10^{20}$ atoms/$cm^3$. The extension perpendicular implants may be of the same material as the main perpendicular implant, or may alternatively include different materials. However, it will be appreciated that the extension implants may be different from one another, if so desired. Next, the main source and drain regions may be formed by a main perpendicular implant, which will not affect the extension implant due to the formation of spacers 476 which act as masks.

The main perpendicular implant is a relatively high energy, high concentration implant which is capable of producing the source and drain deep implant regions 424 and 426. An exemplary range of implant dose for the perpendicular implant is between $1\times10^{14}$ and $2\times10^{15}$ atoms/$cm^2$.

After implantation, the SOI structure 440 is subjected to rapid thermal annealing (RTA). Exemplary RTA may be performed for between five and fifteen seconds at a temperature of 1,020–1,050° C.

The present SOI structure is significantly more efficient at moving carriers and consumes significantly less wafer area than the side-contact solutions heretofore proposed. As will be better appreciated in view of the aforementioned description, such SOI structures may have devices such as MOSFETs formed thereon. Such MOSFETs will be significantly less affected by the floating body effect (FBE) and due to the leaky and characteristics, respectively of the damaged surface of the insulator layer. The carriers, which accumulate near the source/body junctions of the MOSFET, will not accumulate sufficiently to forward bias the body with respect to the source. Thus, the lowering of the threshold voltage through the body-bias effect will be reduced. Further, extra current will not start flowing, thus the "kink" in the I–V characteristics will be significantly reduced or eliminated. Further still, this maintains the achievable gain and dynamic swing in analog circuits, and eliminates the abnormality in the transfer characteristics in digital circuits. Additionally, FBEs related to higher device leakages and the undesirable transient effect would be reduced.

Thus, the present invention allows devices to consume less silicon area and operate at faster speeds.

Although particular embodiments of the invention have been described in detail, it is understood that the invention is not limited correspondingly in scope, but includes all changes, modifications and equivalents coming within the spirit and terms of the claims appended hereto.

What is claimed is:

1. A semiconductor-on-insulator (SOI) structure comprising:

a semiconductor substrate;

an insulator layer disposed on the semiconductor substrate;

a semiconductor layer disposed on the insulator layer; and an interface between the insulator layer and the semiconductor layer and under the entire length of the semiconductor layer that promotes carrier recombination for carriers from active devices formed from the SOI structure, the interface having a heavy ion concentration and formed by damaging the upper surface of the insulator layer with heavy ion implantation before formation of the semiconductor layer on the insulator layer and a grain size tailored to allow a leakage current greater than a leakage current allowed through the insulator layer.

2. The SOI structure according to claim 1, wherein the insulator layer material is an oxide.

3. The SOI structure according to claim 1, wherein the heavy ions are selected from indium (In), arsenic (As), antimony (Sb), argon (Ar), germanium (Ge), neon (Ne), silicon (Si), or xenon (Xe).

4. The SOI structure according to claim 1, wherein the concentration of the heavy ions at or near an upper surface of the insulator layer and forming the interface is about $1\times10^{13}$ atoms/cm$^3$ to about $1\times10^{16}$ atoms/cm$^3$.

5. The SOI structure according to claim 1, wherein the semiconductor substrate material is silicon (Si), silicon carbide (SiC), silicon germanium (SiGe) or any other semiconductive material.

* * * * *

UNITED STATES PATENT AND TRADEMARK OFFICE
CERTIFICATE OF CORRECTION

PATENT NO.     : 6,433,391 B1
DATED          : August 13, 2002
INVENTOR(S)    : En et al.

It is certified that error appears in the above-identified patent and that said Letters Patent is hereby corrected as shown below:

<u>Column 3,</u>
Line 33, replace "$SiO^2$" with -- $SiO_2$ --

<u>Column 4,</u>
Line 9, replace "$SiO^2$" with -- $SiO_2$ --

<u>Column 6,</u>
Line 9, replace "$5 \times 10^8$ atoms/cm" with -- $5 \times 10^{18}$ atoms/cm$^3$ --

Signed and Sealed this

Fifteenth Day of April, 2003

JAMES E. ROGAN
*Director of the United States Patent and Trademark Office*